(12) United States Patent
Pearce et al.

(10) Patent No.: US 8,258,784 B2
(45) Date of Patent: Sep. 4, 2012

(54) SYSTEM AND METHOD FOR MEASURING A TIME-VARYING MAGNETIC FIELD AND METHOD FOR PRODUCTION OF A HYDROCARBON FLUID

(75) Inventors: Jeremiah Glen Pearce, Houston, TX (US); Robert Rex Burnett, Katy, TX (US); Richard Martin Ostermeier, Houston, TX (US); William Mountjoy Savage, Houston, TX (US)

(73) Assignee: Shell Oil Company, Houston, TX (US)

( * ) Notice: Subject to any disclaimer, the term of this patent is extended or adjusted under 35 U.S.C. 154(b) by 320 days.

(21) Appl. No.: 12/666,821

(22) PCT Filed: Jul. 1, 2008

(86) PCT No.: PCT/US2008/068895
§ 371 (c)(1),
(2), (4) Date: Jun. 24, 2010

(87) PCT Pub. No.: WO2009/006465
PCT Pub. Date: Jan. 8, 2009

(65) Prior Publication Data
US 2011/0006764 A1    Jan. 13, 2011

Related U.S. Application Data

(60) Provisional application No. 60/947,820, filed on Jul. 3, 2007.

(51) Int. Cl.
G01R 33/12 (2006.01)
G01R 33/02 (2006.01)
G01B 7/14 (2006.01)

(52) U.S. Cl. .............. 324/258; 324/207.15; 324/228

(58) Field of Classification Search .............. 324/258, 324/207.15, 228
See application file for complete search history.

(56) References Cited

U.S. PATENT DOCUMENTS

| | | | |
|---|---|---|---|
| 3,090,910 A | 5/1963 | Moran | 324/6 |
| 3,993,944 A | 11/1976 | Meador et al. | 324/6 |
| 4,009,434 A | 2/1977 | McKinlay et al. | 324/6 |
| 4,107,598 A | 8/1978 | Meador et al. | 324/6 |
| 4,372,398 A | 2/1983 | Kuckes | 175/45 |

(Continued)

FOREIGN PATENT DOCUMENTS

EP    1494361    1/2005

(Continued)

OTHER PUBLICATIONS

Data sheet Precision Instrumentation amplifier AD524 (Analog Devices, 1999).

(Continued)

Primary Examiner — Reena Aurora (57) ABSTRACT

In accordance with the present disclosure, a system and a method are disclosed for measuring a time varying magnetic field. In one aspect, a system comprises a plurality of induction coils arranged to measure the time varying magnetic field using at least one voltage induced in at least one of the induction coils in the plurality of induction coils, a plurality of snubber circuits connected to the plurality of induction coils, each of the snubber circuits of the plurality of snubber circuits arranged to suppress a resonance of a respective one of the induction coils of the plurality of induction coils, and a summing circuit connected to each of the snubber circuits of the plurality of snubber circuits, the summing circuit arranged to sum voltages induced in each of the induction coils in the plurality of induction coils.

15 Claims, 5 Drawing Sheets

U.S. PATENT DOCUMENTS

| | | | | |
|---|---|---|---|---|
| 4,469,961 A | 9/1984 | Milberger et al. | | 307/270 |
| 4,651,101 A | 3/1987 | Barber et al. | | 324/339 |
| 4,800,496 A | 1/1989 | Barber et al. | | 364/422 |
| 4,814,768 A | 3/1989 | Chang | | 342/22 |
| 4,849,699 A | 7/1989 | Gill et al. | | 324/339 |
| 4,873,488 A | 10/1989 | Barber et al. | | 324/339 |
| 4,933,640 A | 6/1990 | Kuckes | | 324/339 |
| 5,241,273 A | 8/1993 | Luling | | 324/338 |
| 5,293,128 A | 3/1994 | Zhou | | 324/339 |
| 5,299,128 A | 3/1994 | Antoine et al. | | 364/422 |
| 5,329,235 A | 7/1994 | Zhou et al. | | 324/338 |
| 5,467,019 A | 11/1995 | Lester et al. | | 324/339 |
| 5,530,355 A | 6/1996 | Doty | | 324/318 |
| 5,554,929 A | 9/1996 | Doty et al. | | 324/318 |
| 5,678,643 A | 10/1997 | Robbins et al. | | 175/45 |
| 5,729,174 A | 3/1998 | Dijnnebacke et al. | | 330/51 |
| 5,757,191 A | 5/1998 | Gianzero | | 324/339 |
| 5,796,253 A | 8/1998 | Bosnar et al. | | 324/336 |
| 5,844,512 A | 12/1998 | Gorin et al. | | 341/139 |
| 5,923,213 A | 7/1999 | Darthenay et al. | | 330/51 |
| 5,955,884 A | 9/1999 | Payton et al. | | 324/339 |
| 5,966,013 A | 10/1999 | Hagiwara | | 324/339 |
| 6,026,560 A | 2/2000 | Wignall | | 29/607 |
| 6,044,325 A | 3/2000 | Chakravarthy et al. | | 702/7 |
| 6,100,696 A | 8/2000 | Sinclair | | 324/339 |
| 6,181,138 B1 | 1/2001 | Hagiwara et al. | | 324/338 |
| 6,288,664 B1 | 9/2001 | Swanson | | 341/155 |
| 6,486,808 B1 | 11/2002 | Seppi et al. | | 341/139 |
| 6,498,534 B1 | 12/2002 | Kim et al. | | 330/136 |
| 6,777,940 B2 | 8/2004 | Macune | | 324/338 |
| 6,836,229 B2 | 12/2004 | Gregoire | | 341/139 |
| 6,891,376 B2 | 5/2005 | Hanstein et al. | | 324/333 |
| 6,933,724 B2 | 8/2005 | Watkins et al. | | 324/319 |
| 6,952,101 B2 | 10/2005 | Gupta | | 324/339 |
| 7,046,009 B2 | 5/2006 | Itskovich | | 324/338 |
| 7,053,622 B2 | 5/2006 | Sorensen | | 324/346 |
| 7,236,055 B2 | 6/2007 | Halbert et al. | | 330/256 |
| 2003/0038634 A1 | 2/2003 | Strack | | 324/323 |
| 2003/0105591 A1 | 6/2003 | Hagiwara | | 702/7 |
| 2003/0155923 A1 | 8/2003 | Omeragic et al. | | 324/338 |
| 2003/0184299 A1 | 10/2003 | Strack | | 324/323 |
| 2004/0027131 A1 | 2/2004 | Bittar | | 324/343 |
| 2004/0036803 A1 | 2/2004 | Koch | | 348/552 |
| 2004/0107052 A1 | 6/2004 | Banning-Geertsman | | 702/11 |
| 2004/0140091 A1 | 7/2004 | Gupta | | 166/254.1 |
| 2004/0163822 A1 | 8/2004 | Zhang et al. | | 166/380 |
| 2004/0183538 A1 | 9/2004 | Hanstein et al. | | 324/339 |
| 2004/0235436 A1 | 11/2004 | Chao et al. | | 455/126 |
| 2005/0001623 A1 | 1/2005 | Hanstein et al. | | 324/336 |
| 2005/0015709 A1 | 1/2005 | Lavoie et al. | | 715/500 |
| 2005/0015716 A1 | 1/2005 | Lavoie et al. | | 715/511 |
| 2005/0047034 A1 | 3/2005 | Turner | | 361/20 |
| 2005/0068211 A1 | 3/2005 | Arai et al. | | 341/138 |
| 2005/0083120 A1 | 4/2005 | Roos et al. | | 330/86 |
| 2005/0092487 A1 | 5/2005 | Banning et al. | | 166/254.1 |
| 2005/0093546 A1 | 5/2005 | Banning et al. | | 324/338 |
| 2005/0140374 A1 | 6/2005 | Itskovich | | 324/339 |
| 2005/0143920 A1 | 6/2005 | Barber et al. | | 702/7 |
| 2005/0167100 A1 | 8/2005 | Itskovich | | 166/248 |
| 2005/0264293 A1 | 12/2005 | Gao et al. | | 324/326 |
| 2006/0038571 A1 | 2/2006 | Ostermeier et al. | | 324/338 |
| 2006/0043972 A1 | 3/2006 | Williamson, Jr. | | 324/323 |
| 2006/0055411 A1 | 3/2006 | Banning et al. | | 324/338 |
| 2006/0061363 A1 | 3/2006 | Banning et al. | | 324/338 |
| 2006/0061364 A1 | 3/2006 | Banning et al. | | 324/338 |
| 2006/0202699 A1 | 9/2006 | Reiderman | | 324/339 |
| 2006/0208737 A1 | 9/2006 | Merchant et al. | | 324/330 |
| 2006/0238253 A1 | 10/2006 | Ohashi et al. | | 330/254 |
| 2007/0108981 A1 | 5/2007 | Banning-Geertsma et al. | | 324/338 |
| 2007/0229083 A1 | 10/2007 | Tenghamn et al. | | 324/347 |
| 2007/0256832 A1 | 11/2007 | Hagiwara et al. | | 166/250.16 |

FOREIGN PATENT DOCUMENTS

| | | |
|---|---|---|
| GB | 2301902 | 12/1996 |
| GB | 2326782 | 12/1998 |
| WO | WO02075364 | 9/2002 |
| WO | WO03019237 | 3/2003 |
| WO | WO2005047934 | 5/2005 |
| WO | WO2006071615 | 7/2006 |
| WO | WO2007019139 | 2/2007 |

OTHER PUBLICATIONS

Data sheet 8-input priority encoder 74F148 (Philips Semiconductors, 1990).

Data sheet LN161/LM261/LM361 High speed differential comparators (National semiconductors 1999).

Specifications and Architectures of Sample and hold Amplifiers, National Semiconductors application note AN 775 (1992).

SYSTEM AND METHOD FOR MEASURING A TIME-VARYING MAGNETIC FIELD AND METHOD FOR PRODUCTION OF A HYDROCARBON FLUID

PRIORITY CLAIM

The present application claims priority from PCT/US2008/068895, filed 1 Jul. 2008, which claims priority from U.S. Provisional Application 60/947,820 filed 3 Jul. 2007.

TECHNICAL FIELD OF THE PRESENT DISCLOSURE

The present disclosure relates to a system and method for measuring a time-varying magnetic field. The present disclosure further relates to a method for producing a mineral hydrocarbon fluid.

BACKGROUND OF THE PRESENT DISCLOSURE

Exploration and production of hydrocarbons from subterranean formations often requires measurements of properties of the subterranean formations. For example, eddy currents induced in the subterranean formations may be used to provide measurements of the resistivity of the subterranean formations, which, in turn, may be used to determine where to drill to produce subterranean hydrocarbons. These induced eddy currents may themselves be measured by measuring small time-varying magnetic fields.

Measuring small time-varying magnetic fields with an induction coil requires the induction coil have a large effective cross-sectional area. In situations such as downhole in a borehole, there is a limit on the permissible diameter of the induction coil. Consequently, conventional approaches resort to increasing the number of turns of the induction coil to increase the effective cross-sectional area. However, as the number of turns of the induction coil increases, the resonant frequency of the induction coil decreases, limiting the usable bandwidth of the induction coil.

Reiderman, in U.S. Patent Application Publication Number 2006/0202699, published Sep. 14, 2006, appears to disclose a magnetic sensing assembly for measuring magnetic fields produced by a time-varying electric current generated in geological formations. The assembly comprises a soft magnetic core, a sensing coil wound on the core, and at least one miniature low noise magnetic field sensor disposed near an edge of the magnetic core. In one disclosed embodiment, the sensing induction coil comprises a plurality of sections disposed on the magnetic core, each section connected to its own low noise operational amplifier. However, such an assembly does not suppress unwanted coil resonances.

SUMMARY OF THE PRESENT DISCLOSURE

The present invention provides a system and a method for measuring a time-varying magnetic field. In one aspect, the system comprises a plurality of induction coils arranged to measure the time-varying magnetic field using at least one voltage induced in at least one of the induction coils in the plurality of induction coils. The system also comprises a plurality of snubber circuits connected to the plurality of induction coils, each of the snubber circuits of the plurality of snubber circuits arranged to suppress a resonance of a respective one of the induction coils of the plurality of induction coils. The system also comprises a summing circuit connected to each of the snubber circuits of the plurality of snubber circuits, the summing circuit arranged to sum voltages induced in each of the induction coils in the plurality of induction coils.

In another aspect, a system for measuring a time-varying magnetic field comprises a plurality of induction coils each arranged to produce an induction voltage in response to the time-varying magnetic field. The system also comprises a plurality of snubber circuits connected to the plurality of induction coils, each of the snubber circuits of the plurality of snubber circuits arranged to suppress a resonance of a respective one of the induction coils of the plurality of induction coils. The system also comprises a summing circuit connected to each of the snubber circuits of the plurality of snubber circuits, the summing circuit arranged to sum the induction voltage induced in each of the induction coils in the plurality of induction coils.

In yet another aspect, a method for measuring a time-varying magnetic field is provided, the method comprising arranging a plurality of induction coils to measure the time-varying magnetic field using at least one voltage induced in at least one of the induction coils in the plurality of induction coils. The method also comprises arranging a plurality of snubber circuits to suppress a resonance of a respective one of the induction coils of the plurality of induction coils, each of the snubber circuits of the plurality of snubber circuits connected to the respective one of the induction coils of the plurality of induction coils. The method also comprises summing voltages induced in each of the induction coils in the plurality of induction coils using a summing circuit connected to each of the snubber circuits of the plurality of snubber circuits.

BRIEF DESCRIPTION OF THE DRAWINGS

The following figures form part of the present specification and are included to further demonstrate certain aspects of the present claimed subject matter, and should not be used to limit or define the present claimed subject matter. Consequently, a more complete understanding of the present embodiments and further features and advantages thereof may be acquired by referring to the following description taken in conjunction with the accompanying drawings, in which the leftmost significant digit(s) in the reference numerals denote(s) the first figure in which the respective reference numerals appear, wherein:

It is to be noted, however, that the appended drawings illustrate only typical embodiments of the present claimed subject matter and are, therefore, not to be considered limiting of the scope of the present claimed subject matter, as the present claimed subject matter may admit to other equally effective embodiments.

DETAILED DESCRIPTION OF ILLUSTRATIVE EMBODIMENTS

The present disclosure relates to a system and method for measuring a time-varying magnetic field. The present disclosure further relates to a method for producing a mineral hydrocarbon fluid. More particularly, the present disclosure describes a system and a method useful for measuring small time-varying magnetic fields that result from induced eddy currents in subterranean formations.

Measuring small time-varying magnetic fields with an induction coil requires the induction coil have a large effective cross-sectional area. In situations such as downhole in a borehole, there is a limit on the permissible diameter of the induction coil. Consequently, as described above, conventional approaches resort to increasing the number of turns N of the induction coil to increase the effective cross-sectional area. However, as described herein, as the number of turns N of the induction coil increases, the resonant frequency of the induction coil decreases, limiting the usable bandwidth of the induction coil. This may be circumvented in various illustrative embodiments, as described below in more detail, by using a plurality of relatively small induction coils that each have relatively high resonant frequencies and summing or adding the voltages induced in any and all of the plurality of relatively small induction coils, resulting in a system of coils that is very sensitive and has a relatively large usable bandwidth. The terms "relatively small induction coils," "relatively high resonant frequency," and "relatively large (usable) bandwidth" as used herein may all be "relative" to a conventional induction coil having a cross-sectional area substantially similar to the total cross-sectional area of the plurality of induction coils in various illustrative embodiments, where the conventional induction coil has a greater number of turns N than any of the induction coils in the plurality of induction coils in various illustrative embodiments.

Figure 1A:
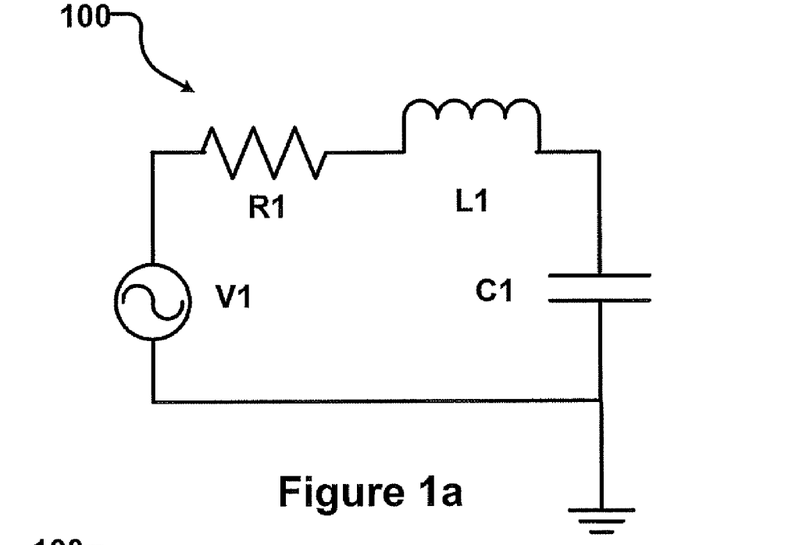
FIGS. 1*a*-1*d* schematically illustrate various examples relevant to various illustrative embodiments.
Figure 1B:
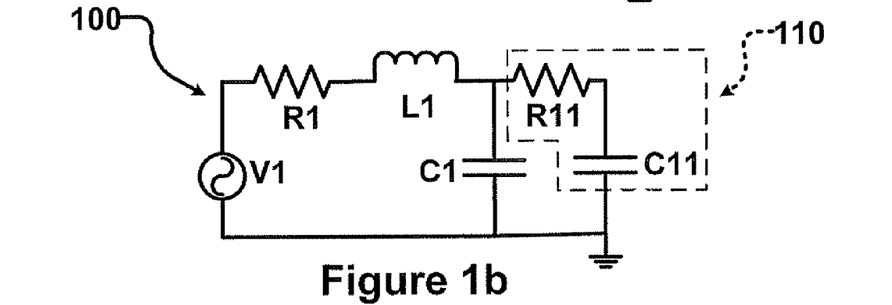
Figure 1C:
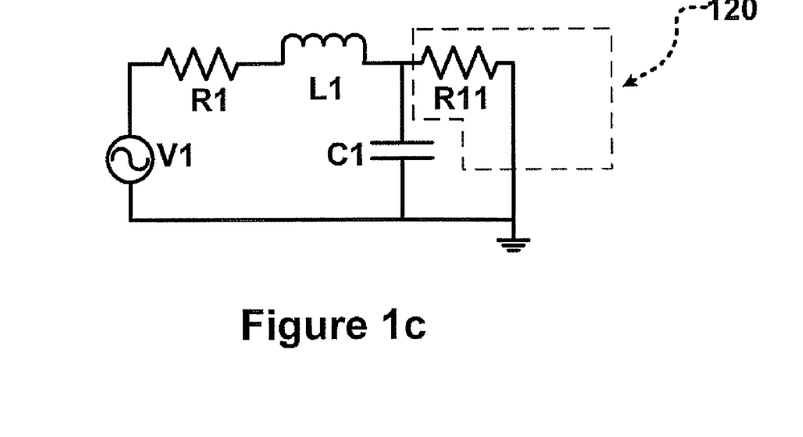
Figure 1D:
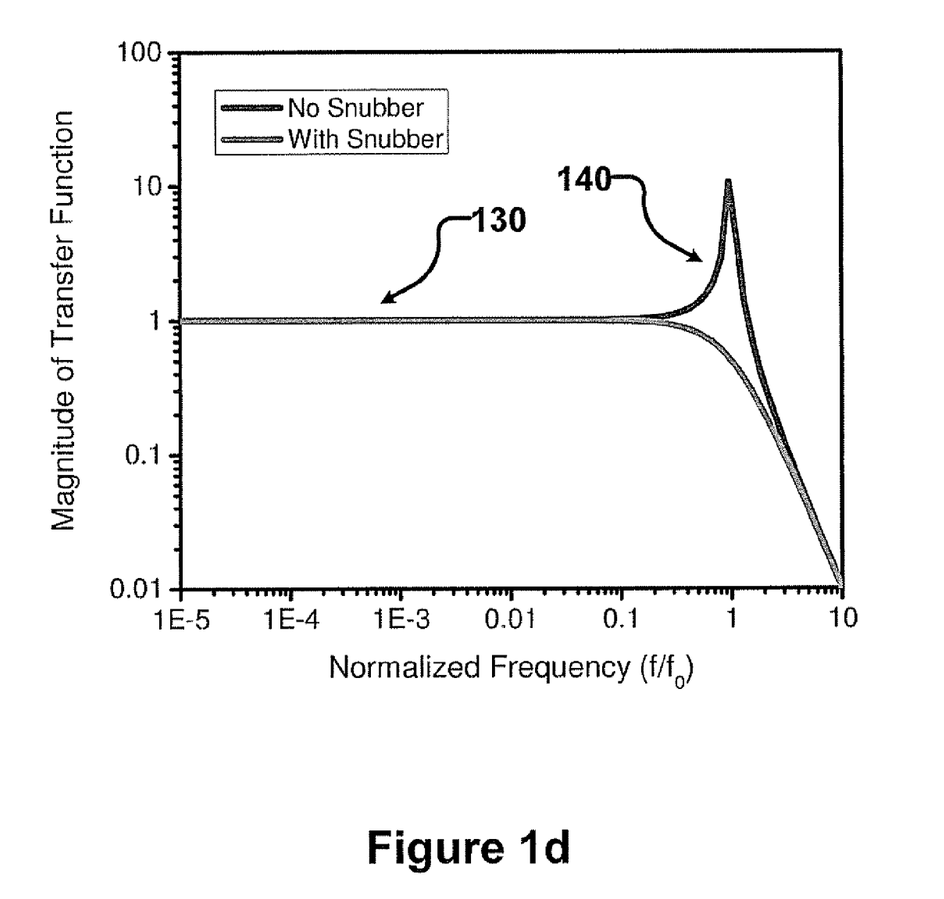

The importance of suppressing unwanted coil resonances may be schematically illustrated, as shown, for example, in FIG. 1d. The frequency response of a coil with a snubber circuit, such as snubber circuits 110, 120, described in more detail below, is as indicated at 130. The frequency response of a coil without a snubber circuit is as indicated at 140.

FIGS. 1a-1d schematically illustrate various examples relevant to various illustrative embodiments, according to the present disclosure. FIG. 1a schematically illustrates a circuit representing an equivalent coil model 100, with a voltage source having an induced voltage V1, induced by a time-varying magnetic field passing through the coil represented by the equivalent coil model 100, a resistor having a resistance R1, an inductor having an inductance L1, and a capacitor having a capacitance C1. The measurable voltage is across the capacitor having a capacitance C1, which represents the capacitance of the coil modeled by the equivalent coil model 100. The voltage source having induced voltage V1 and the capacitor having the capacitance C1 may both be connected to ground, as shown, for example, in FIG. 1a, because the coil itself is grounded. In various illustrative embodiments, depending on a design choice, the resistance R1 may be in a range of from about 0Ω to about 5 kΩ, the inductance L1 may be in a range of from about 0 H to about 1 H, and the capacitance C1 may be in a range of from about 1 pF to about 1 nF.

The induced voltage V1 drives an induced current I through the circuit, flowing according to Lenz's law to oppose the time-varying magnetic field, producing power given by:

$$(V1)I = \frac{dW_{magnetic}}{dt} + \frac{dW_{electrical}}{dt} + Q_{Joule}$$

$$= \frac{d}{dt}\left(\frac{1}{2}(L1)I^2\right) + \frac{d}{dt}\left(\frac{1}{2}\left(\frac{1}{C1}\right)q^2\right) + (R1)I^2$$

$$= (L1)I\frac{d}{dt}(I) + \frac{q}{(C1)}\frac{d}{dt}(q) + (R1)I^2$$

$$= (L1)I\frac{d}{dt}(I) + \frac{q}{(C1)}I + (R1)I^2$$

where $W_{magnetic}$ is the magnetic energy stored in the inductor having the inductance L1, $W_{electrical}$ is the electrical energy stored in the capacitor having the capacitance C1, q is the charged stored in the capacitor having the capacitance C1, $$I = \frac{dq}{dt}$$

is the induced current, and $Q_{Joule}$ is the heat dissipated in the resistor having the resistance R1. Cancellation of a common factor of I yields $$(V1) = (L1)\frac{d}{dt}(I) + \frac{q}{(C1)} + (R1)I,$$

which, when differentiated, gives $$\frac{d}{dt}(V1) =$$

$$(L1)\frac{d^2}{dt^2}(I) + \frac{1}{(C1)}\frac{dq}{dt} + (R1)\frac{d}{dt}I = (L1)\frac{d^2}{dt^2}(I) + \frac{1}{(C1)}I + (R1)\frac{d}{dt}I,$$

an inhomogeneous second order differential equation.

The natural frequency $\omega_0$ of free, non-driven oscillations of the equivalent coil model 100 follows from solutions of the homogeneous equation $$(L1)\frac{d^2}{dt^2}(I) + (R1)\frac{d}{dt}I + \frac{1}{(C1)}I = 0,$$

assuming a solution of the form $I = I_0 e^{i\omega_0 t} = I_0[\cos(\omega_0 t) + i \sin(\omega_0 t)]$, where $i \equiv \sqrt{-1}$ is the base of the complex number system, using the real part, $Re\{I_0 e^{i\omega_0 t}\} = I_0 \cos(\omega_0 t)$, as needed. The homogeneous equation thus becomes $$-(L1)\omega_0^2 + i(R1)\omega_0 + \frac{1}{(C1)} = 0.$$

Without damping, when R1=0, this simply becomes $$-(L1)\omega_0^2 + \frac{1}{(C1)} = 0,$$

so that $$\omega_0^2 = \frac{1}{(L1)(C1)},$$

showing that the natural frequency, and, consequently, the resonant frequency of the equivalent coil model 100 decreases with increasing inductance L1.

The magnetic energy of a coil may be given by $$W_{magnetic} = \frac{\mu}{2}H^2[\pi a^2 l] = \frac{\mu}{2}\left(\frac{NI}{l}\right)^2[\pi a^2 l] = \frac{1}{2}\left\{\left(\frac{N}{l}\right)N\pi a^2\right\}I^2 \cong \frac{1}{2}LI^2,$$

for a coil having a cross-sectional area $\pi a^2$, length l, number of turns N, and inductance $$L \cong \left(\frac{N}{l}\right)N\pi a^2.$$

For a fixed number of turns per length $$\frac{N}{l},$$

the inductance L therefore increases as the number of turns N increases. Since the natural frequency $$\omega_0 = \frac{1}{\sqrt{(L1)(C1)}},$$

and, hence, the resonant frequency of the equivalent coil model 100 decreases as the inductance L1 increases, and since the inductance L1 increases as the number of turns N of the coil represented by the equivalent coil model 100 increases, a coil with a smaller number of turns N may have a relatively higher natural frequency, and, consequently, a relatively higher resonant frequency. A relatively higher resonant frequency correlates with a relatively larger usable bandwidth for the coil represented by the equivalent coil model 100.

With damping, when $R \neq 0$, the homogeneous equation $$-(L1)\omega_0^2 + i(R1)\omega_0 + \frac{1}{(C1)} = 0,$$

as a quadratic equation, admits solutions for the natural frequency $\omega_0$ as follows:

$$\omega_0 = \frac{-[i(R1)] \pm \sqrt{[i(R1)]^2 - 4[-(L1)]\left\{\frac{1}{(C1)}\right\}}}{2[-(L1)]}$$

$$= \frac{i(R1) \pm \sqrt{-(R1)^2 + 4\left\{\frac{(L1)}{(C1)}\right\}}}{2(L1)}$$

$$= \frac{i(R1)}{2(L1)} \pm \sqrt{\frac{1}{(L1)(C1)} - \frac{(R1)^2}{4(L1)^2}}$$

which is purely imaginary when $$\frac{1}{(L1)(C1)} < \frac{(R1)^2}{4(L1)^2},$$

giving an a periodic $I = I_0 e^{-|\omega_0|t}$ that decreases monotonically. When $$\frac{1}{(L1)(C1)} > \frac{(R1)^2}{4(L1)^2},$$

the current is periodic and usually well approximated by $I = I_0 e^{-(R1)t/[2(L1)]} e^{\pm it/\sqrt{(L1)(C1)}}$.

With damping, and with the coil of FIG. 1a driven at a frequency $\omega$ by $(V1) = (V1)_0 e^{i\omega t}$.

$$(V1) = (L1)\frac{d}{dt}(I) + \frac{q}{(C1)} + (R1)I = (L1)\frac{d}{dt}(I) + \frac{\int I dt}{(C1)} + (R1)I \text{ is}$$

$$(V1)_0 e^{i\omega t} = i\omega(L1)I_0 e^{i\omega t} + \frac{I_0 e^{i\omega t}}{i\omega(C1)} +$$

$$(R1)I_0 e^{i\omega t} = \left[(R1) + i\left\{\omega(L1) - \frac{1}{\omega(C1)}\right\}\right]I_0 e^{i\omega},$$

which expresses Ohm's law for alternating currents: $(V1) = IZ$, where the complex impedance Z is given by $$Z \equiv \left[(R1) + i\left\{\omega(L1) - \frac{1}{\omega(C1)}\right\}\right] \equiv |Z|e^{i\alpha},$$

with modulus $$|Z| = +\sqrt{(R1)^2 + \left\{\omega(L1) - \frac{1}{\omega(C1)}\right\}^2}$$

and phase angle tan $$\alpha = \frac{\omega(L1) - 1/[\omega(C1)]}{(R1)}.$$

When the driving frequency $\omega$ is close to the natural or resonant frequency of the coil represented by the equivalent coil model 100, resonance may occur.

FIGS. 1b-1c schematically illustrate adding a snubber circuit 110 to the equivalent coil model 100. The snubber circuit 110 may comprise a resistor having a resistance R11 in series with a capacitor having a capacitance C11, both connected in parallel with the capacitor having the capacitance C1, as shown, for example, in FIG. 1b. In various alternative embodiments, a snubber circuit 120 may comprise just a resistor having a resistance R11 connected in parallel with the capacitor having the capacitance C1, as shown, for example, in FIG. 1c. The voltage source having induced voltage V1, the capacitor having the capacitance C1, and the capacitor having the capacitance C11 may all be connected to ground, as shown, for example, in FIGS. 1b-1c, again because the coils themselves are grounded. The resistor having the resistance R11 in series with the capacitor having a capacitance C11, may give an equivalent impedance Z11 given by (Z11)= (R11)+1/[iω(C11)]=(R11)−i/[ω(C11)]. The impedance Z11 in parallel with the capacitor having the capacitance C1 may give an equivalent impedance Z1 given by $$\frac{1}{(Z1)} = \frac{1}{(Z11)} + i\omega(C1).$$

FIG. 1d, as described above, schematically illustrates the importance of the snubber circuit 110, 120 in suppressing the resonance of the coil. FIG. 1d shows the frequency response of a coil with a snubber circuit, such as the snubber circuit 110, 120, as indicated at 130. FIG. 1d also shows the frequency response of a coil without a snubber circuit, as indicated at 140.

A benefit of having a capacitor with the capacitance C11 shunting the coil, as is the case in snubber circuit 110 in FIG. 1b, is that the response of the coil can be measured over the capacitor with the capacitance C11. In particular where the capacitance C11 is higher than the distributed capacitance C1 of the induction coils this is advantageous, since then the system response is more predominantly determined by the higher capacitance C11 so that the coil/snubber system response is less affected when connecting a voltage measurement device to the snubber than it would be in the case of the snubber of FIG. 1c that has no capacitor. This renders measurement of the coil response less sensitive to the particular characteristics of the voltage measurement device. The benefit is even greater when the capacitor has a capacitance C11 that is higher than a capacitance of the voltage measurement device.

These principles are applicable also to systems that, other than embodiments that will be described below, do not have a plurality of inductions coils and summing circuits connected snubber circuits of the plurality of snubber circuits.

Figure 2:
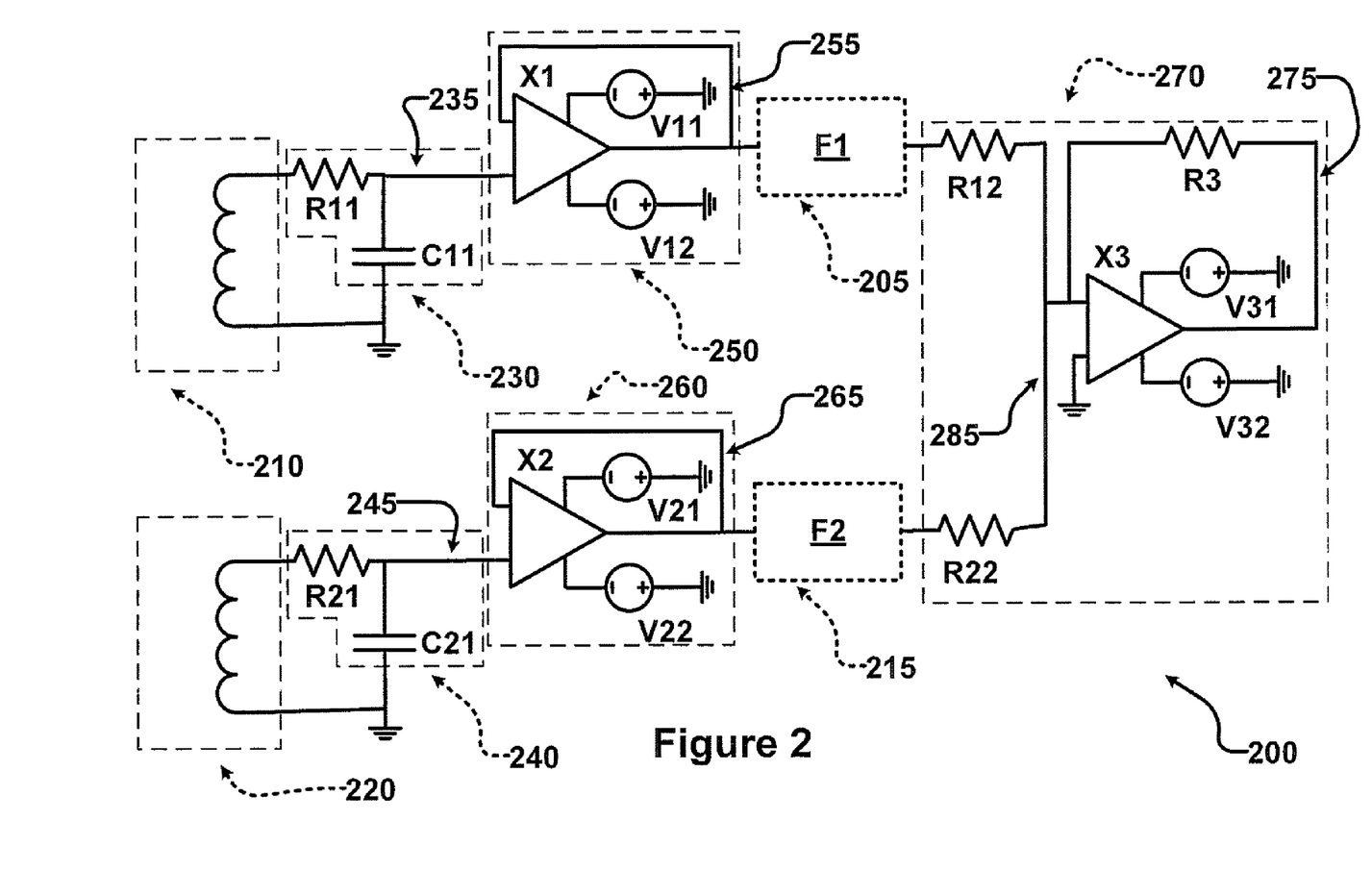
FIG. 2 schematically illustrates a particular example representative of various illustrative embodiments of a system useful for measuring time-varying magnetic fields.

FIG. 2 schematically illustrates a particular example representative of various illustrative embodiments of a system 200 useful for measuring time-varying magnetic fields, according to the present disclosure. The system 200 may comprise two induction coils 210, 220, each similar to the equivalent induction coil model 100. The two induction coils 210, 220 may be arranged to measure the time-varying magnetic field inducing voltages (similar to the voltage V1) in one or more of the induction coils 210, 220. The system 200 may also comprise a plurality of snubber circuits 230, 240 connected to each of the induction coils 210, 220, respectively. Each of the snubber circuits 230, 240 may be arranged to suppress a resonance of a respective one of the induction coils 210, 220. The system 200 may also comprise a summing circuit 270 connected by connection 285 to each of the snubber circuits 230, 240 connected to each of the induction coils 210, 220, as shown, for example, in FIG. 2. The summing circuit 270 may be arranged to sum the voltages induced in the induction coils 210, 220. The summing circuit 270 may be a summing amplifier circuit, in various illustrative embodiments, as shown, for example, in FIG. 2. The voltages induced in each of the induction coils 210, 220 may or may not be equal to a voltage such as the voltage V1 described above, depending on the bandwidth of the transient magnetic field measured in the induction coils 210, 220.

The snubber circuits 230, 240 may be respective predetermined snubber circuits 230, 240. The respective predetermined snubber circuits 230, 240 may be appropriately chosen and arranged to suppress respective resonances of each of the induction coils 210, 220, as shown, for example, in FIG. 1d.

The snubber circuit 230 may comprise a resistor having a resistance R11 in series with a capacitor having a capacitance C11, both connected in parallel with the induction coil 210. Alternatively, the snubber circuit 230 may comprise just a resistor having a resistance R11 connected in parallel with the induction coil 210. The snubber circuit 240 may comprise a resistor having a resistance R21 in series with a capacitor having a capacitance C21, both connected in parallel with the induction coil 220. Alternatively, the snubber circuit 240 may comprise just a resistor having a resistance R21 connected in parallel with the induction coil 220.

The summing circuit 270 may comprise an operational amplifier (op-amp) X3 connected to respective grounded voltage sources V31 and V32. The op-amp X3 may have negative feedback to an inverting input, which is also connected ultimately to the induction coils 210, 220, through the connection 275. The op-amp X3 may also be grounded at a non-inverting input, as shown, for example, in FIG. 2. As shown, for example, in FIG. 2, the summing circuit 270 may comprise respective resistors having respective resistances R12 and R22 between the respective induction coils 210, 220 and the connection 285.

The system 200 may further comprise respective voltage follower circuits 250, 260. The respective voltage follower circuits 250, 260 may be connected between each respective predetermined snubber circuit 230, 240, as shown by the connections 235 and 245, and the summing circuit 270, as shown by the connection 285. The voltage follower circuits 250, 260 may be arranged to buffer one or more inputs to the summing circuit 270. In various illustrative embodiments, each of the induction coils 210, 220 may optionally use a respective filter F1, F2, as indicated (in phantom) at 205, 215, between the respective voltage follower circuits 250, 260 and the summing circuit 270. The respective filters F1, F2, may be arranged to filter one or more inputs to the summing circuit 270.

The voltage follower circuit 250 may comprise an op-amp X1 connected to respective grounded voltage sources V11 and V12, the op-amp X1 having negative feedback 255 to an inverting input and being connected at a non-inverting input to the predetermined snubber circuit 230 through the connection 235. The voltage follower circuit 260 may comprise an op-amp X2 connected to respective grounded voltage sources V21 and V22, the op-amp X2 having negative feedback 265 to an inverting input and being connected at a non-inverting input to the predetermined snubber circuit 240 through the connection 245. The summing circuit 270 may be arranged to sum the voltages output by the respective voltage follower circuits 250, 260, which are substantially equal to the voltages across the respective snubber circuits 230, 240.

Figure 3:
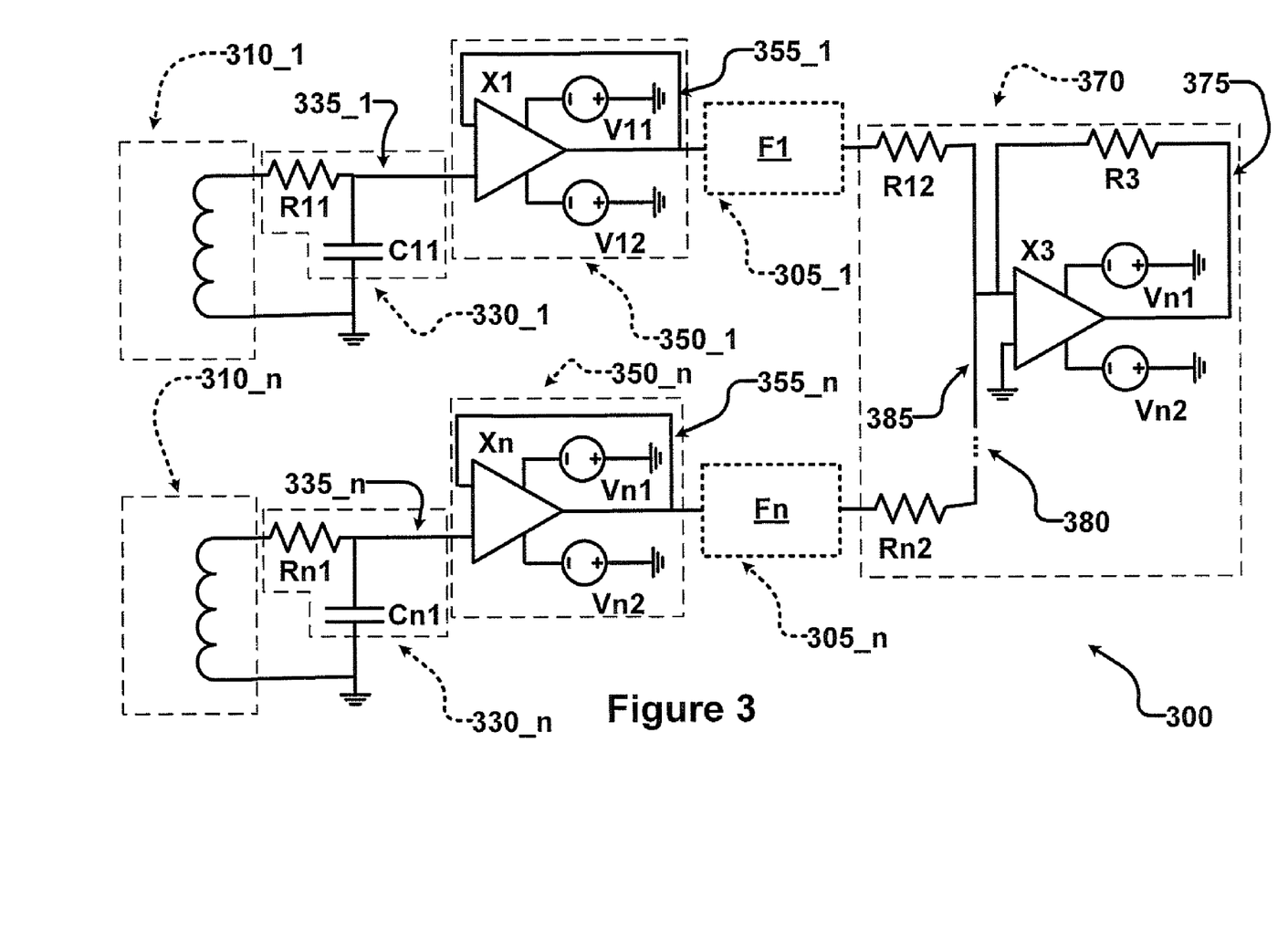
FIG. 3 schematically illustrates another particular example representative of various illustrative embodiments of a system useful for measuring time-varying magnetic fields.

FIG. 3 schematically illustrates another particular example representative of various illustrative embodiments of a system 300 useful for measuring time-varying magnetic fields, according to the present disclosure. The system 300 may comprise n induction coils 310_1, . . . , 310_n, where n may be any integer greater than one. Each of the induction coils 310_1, . . . , 310_n may be similar to the equivalent induction coil model 100. The induction coils 310_1, . . . , 310_n may be arranged to measure the time-varying magnetic field inducing voltages (similar to the voltage V1) in one or more of the induction coils 310_1, . . . , 310_n. The system 300 may also comprise a plurality of snubber circuits 330_1, . . . , 330_n connected to each of the induction coils 310_1, . . . , 310_n, respectively. Each of the snubber circuits 330_1, . . . , 330_n may be arranged to suppress a resonance of a respective one of the induction coils 310_1, . . . , 310_n. The system 300 may also comprise a summing circuit 270 connected by connection 385 to each of the snubber circuits 330_1, ..., 330_n connected to each of the induction coils 310_1, ..., 310_n, as shown, for example, in FIG. 3. A summing circuit 370 may be arranged to sum the voltages induced in the induction coils 310_1, ..., 310_n. The summing circuit 370 may be a summing amplifier circuit, in various illustrative embodiments, as shown, for example, in FIG. 3. The voltages induced in each of the induction coils 310_1, ..., 310_n may or may not be equal to a voltage such as the voltage V1 described above, depending on the bandwidth of the transient magnetic field measured in the induction coils 310_1, ..., 310_n.

The snubber circuits 330_1, ..., 330_n may be respective predetermined snubber circuits 330_1, ..., 330_n. The respective predetermined snubber circuits 330_1, ..., 330_n may be appropriately chosen and arranged to suppress respective resonances of each of the induction coils 310_1, ..., 310_n, as shown, for example, in FIG. 1d. The snubber circuit 330_1 may comprise a resistor having a resistance R11 in series with a capacitor having a capacitance C11, both connected in parallel with the induction coil 310_1. Alternatively, the snubber circuit 330_1 may comprise just a resistor having a resistance R11 connected in parallel with the induction coil 310_1. The snubber circuit 330_n may comprise a resistor having a resistance Rn1 in series with a capacitor having a capacitance Cn1, both connected in parallel with the induction coil 310_n. Alternatively, the snubber circuit 330_n may comprise just a resistor having a resistance Rn1 connected in parallel with the induction coil 310_n.

For $1 \leq k \leq n$, the snubber circuit 330_k may comprise a resistor having a resistance Rk1 in series with a capacitor having a capacitance Ck1, both connected in parallel with the induction coil 310_k. Alternatively, the snubber circuit 330_k may comprise just a resistor having a resistance Rk1 connected in parallel with the induction coil 310_k. In various illustrative embodiments, the resistance Rk1 may be in a range of from about 20Ω to about 100 kΩ, and the capacitance Ck1 may be in a range of from about 1 pF to about 1 μF.

In various alternative illustrative embodiments, a sufficiently large capacitance Ck1 may be useful in decreasing sensitivity to the input impedance characteristics of the summing circuit 370. This may make it easier to design the induction coil 310_k and the snubber circuit 330_k combination, because, by choosing a sufficiently high capacitance Ck1 relative to the capacitance of the induction coil 310_k and the summing circuit 370, the design may be done essentially independently of the summing circuit 370. The voltage on the induction coil 310_k may be best measured over the capacitor having the capacitance Ck1. A suitable capacitance Ck1 may be higher than the distributed capacitance of the induction coil 310_k (or the induction coil 310_k segment) that is shunted, for example, higher than about 10 pF, for instance in a range of from about 10 pF to about 10 μF. In one particular illustrative embodiment, a capacitance Ck1 of about 100 pF has been used.

The summing circuit 370 may comprise an operational amplifier (op-amp) X3 connected to respective grounded voltage sources V31 and V32. The op-amp X3 may have negative feedback 375, through a resistor having a resistance R3, to an inverting input, which is also connected ultimately to the induction coils 310_1, ..., 310_n through the connection 385, as indicated at 380. The op-amp X3 may also be grounded at a non-inverting input, as shown, for example, in FIG. 3. In various illustrative embodiments, the resistance R3 may be in a range of from about 100Ω to about 100 kΩ, depending on a design choice. A resistance value that is too high may lead to shot noise. As shown, for example, in FIG. 3, the summing circuit 370 may comprise respective resistors having respective resistances R12, ..., Rn2 between the respective induction coils 310_1, ..., 310_n and the connection 385, as indicated at 380. In various illustrative embodiments, the respective resistances R12, ..., Rn2 may be in a range of from about 100Ω to about 100 kΩ, depending on a design choice.

The system 300 may further comprise respective voltage follower circuits 350_1, ..., 350_n. The respective voltage follower circuits 350_1, ..., 350_n may be connected between each respective predetermined snubber circuit 330_1, ..., 330_n as shown by the connections 335_1, ..., 335_n, and the summing circuit 370, as shown by the connection 385, as indicated at 380. The voltage follower circuits 350_1, ..., 350_n may be arranged to buffer one or more inputs to the summing circuit 370. In various illustrative embodiments, each of the induction coils 310_1, ..., 310_n may optionally use a respective filter F1, ..., Fn, as indicated (in phantom) at 305_1, ..., 305_n, between the respective voltage follower circuits 350_1, ..., 350_n and the summing circuit 370. The respective filters F1, ..., Fn, may be arranged to filter one or more inputs to the summing circuit 370. For $1 \leq k \leq n$, the induction coil 310_k may optionally use the filter Fk between the respective voltage follower circuits 350_k and the summing circuit 370. The respective filter Fk may be arranged to filter a respective input to the summing circuit 370.

The voltage follower circuit 350_1 may comprise an op-amp X1 connected to respective grounded voltage sources V11 and V12, the op-amp X1 having negative feedback 355_1 to an inverting input and being connected at a non-inverting input to the predetermined snubber circuit 330_1 through the connection 335_1. The voltage follower circuit 350_n may comprise an op-amp Xn connected to respective grounded voltage sources Vn1 and Vn2, the op-amp Xn having negative feedback 355_n to an inverting input and being connected at a non-inverting input to the predetermined snubber circuit 330_n through the connection 335_n.

For $1 \leq k \leq n$, the voltage follower circuit 350_k may comprise an op-amp Xk connected to respective grounded voltage sources Vk1 and Vk2. The op-amp Xk may have negative feedback 355_k to an inverting input and be connected at a non-inverting input to the predetermined snubber circuit 330_k through the connection 335_k.

Figure 4:
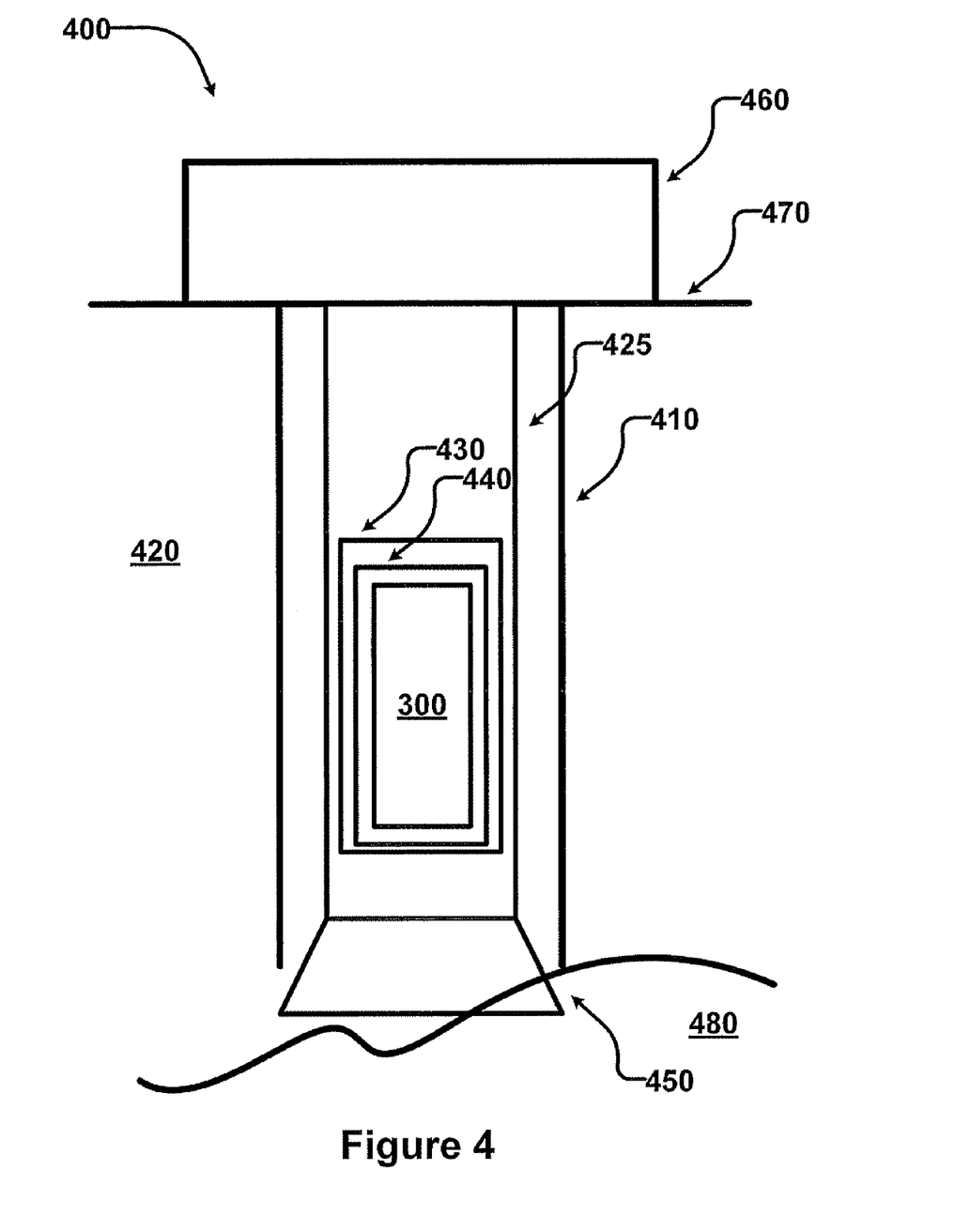
FIG. 4 schematically illustrates yet another particular example representative of various illustrative embodiments of a system useful for measuring time-varying magnetic fields.

FIG. 4 schematically illustrates a particular example representative of various illustrative embodiments of a system 400 useful for measuring time-varying magnetic fields, according to the present disclosure. In various illustrative embodiments, the system 400 for measuring a time-varying magnetic field may comprise a borehole 410 associated with a subterranean formation 420. The system 400 may also comprise a downhole transient electromagnetic (TEM) deep reading tool 430 having a receiver 440 disposed in a drill string 425. disposed in the borehole 410. The receiver 440 may comprise summing receiver coils comprising the system 300. The downhole transient electromagnetic (TEM) deep reading tool 430 may comprise a deep reading electromagnetic (DEM) system 430 arranged to measure time-varying magnetic fields that result from induced eddy currents in the formation 420. The DEM system 430 may be used to measure resistivity deep into the formation 420, around and/or ahead of a drill bit 450 and even into a zone 480 containing mineral hydrocarbon fluids. The system 400 may further comprise a surface drilling facility 460 disposed on a surface 470. The system 400 may be useful for producing at least a portion of the mineral hydrocarbon fluids from the zone 480.

In accordance with the present disclosure, a system and a method are disclosed that are useful for measuring a time-varying magnetic field. In one aspect, a system comprises a plurality of induction coils arranged to measure the time-varying magnetic field using at least one voltage induced in at least one of the induction coils in the plurality of induction coils. The system also comprises a plurality of snubber circuits connected to the plurality of induction coils, each of the snubber circuits of the plurality of snubber circuits arranged to suppress a resonance of a respective one of the induction coils of the plurality of induction coils. The system also comprises a summing circuit connected to each of the snubber circuits of the plurality of snubber circuits, the summing circuit arranged to sum voltages induced in each of the induction coils in the plurality of induction coils.

In various aspects, the system further comprises one or more of the following: (1) each of the induction coils of the plurality of induction coils having a relatively high resonant frequency in a range of from about 100 kHz to about 10 MHz, (2) the plurality of induction coils having a relatively large bandwidth in a range of from about 100 kHz to about 10 MHz, and (3) each of the induction coils of the plurality of induction coils using a voltage follower circuit connected between each snubber circuit and the summing circuit, the voltage follower circuit arranged to buffer an input to the summing circuit. When each of the induction coils of the plurality of induction coils using the voltage follower circuit connected between each snubber circuit and the summing circuit, each of the induction coils of the plurality of induction coils may optionally use a filter between the voltage follower circuit and the summing amplifier circuit.

In another aspect, a system for measuring a time-varying magnetic field comprises a plurality of induction coils each arranged to produce an induction voltage in response to the time-varying magnetic field. The system also comprises a plurality of snubber circuits connected to the plurality of induction coils, each of the snubber circuits of the plurality of snubber circuits arranged to suppress a resonance of a respective one of the induction coils of the plurality of induction coils. The system also comprises a summing circuit connected to each of the snubber circuits of the plurality of snubber circuits, the summing circuit arranged to sum the induction voltage induced in each of the induction coils in the plurality of induction coils.

In various aspects, the system further comprises one or more of the following: (1) each of the induction coils of the plurality of induction coils having a relatively high resonant frequency in a range of from about 100 kHz to about 10 MHz and the plurality of induction coils having a relatively large bandwidth in a range of from about 100 kHz to about 10 MHz and (2) each of the induction coils of the plurality of induction coils using a voltage follower circuit connected between each snubber circuit and the summing circuit, the voltage follower circuit arranged to buffer an input to the summing circuit. When each of the induction coils of the plurality of induction coils using the voltage follower circuit connected between each snubber circuit and the summing circuit, each of the induction coils of the plurality of induction coils may optionally use a filter between the voltage follower circuit and the summing amplifier circuit.

In yet another aspect, a method for measuring a time-varying magnetic field is provided, the method comprising arranging a plurality of induction coils to measure the time-varying magnetic field using at least one voltage induced in at least one of the induction coils in the plurality of induction coils. The method also comprises arranging a plurality of snubber circuits to suppress a resonance of a respective one of the induction coils of the plurality of induction coils, each of the snubber circuits of the plurality of snubber circuits connected to the respective one of the induction coils of the plurality of induction coils, arranged. The method also comprises summing voltages induced in each of the induction coils in the plurality of induction coils using a summing circuit connected to each of the snubber circuits of the plurality of snubber circuits.

In various aspects, the method further comprises producing at least a portion of mineral hydrocarbon fluids using a downhole transient electromagnetic deep reading tool comprising a receiver comprising the plurality of induction coils, the plurality of snubber circuits, and the summing circuit. The plurality of induction coils, the plurality of snubber circuits, and the summing circuit are disposed in the receiver disposed in the downhole transient electromagnetic deep reading tool disposed in a borehole associated with a subterranean formation having a zone having the mineral hydrocarbon fluids associated therewith.

In accordance with the present disclosure, a device, a system, and a method useful for measuring a time-varying magnetic field are disclosed. In various aspects, a device in accordance with the present disclosure may comprise means for measuring a time-varying magnetic field and means for enabling the means for measuring the time-varying magnetic field, both the means for measuring the time-varying magnetic field and the means for enabling the means for measuring the time-varying magnetic field covering corresponding structures and/or materials described herein and equivalents thereof.

In various other aspects, a system in accordance with the present disclosure may comprise means for measuring the time-varying magnetic field, means for enabling the means for measuring the time-varying magnetic field, and means for using the means for measuring the time-varying magnetic field, all of the means for measuring the time-varying magnetic field, the means for enabling the means for measuring the time-varying magnetic field, and the means for using the means for measuring the time-varying magnetic field covering corresponding structures and/or materials described herein and equivalents thereof. In yet various other aspects, a method in accordance with the present disclosure may comprise steps for measuring the time-varying magnetic field and steps for enabling the steps for measuring the time-varying magnetic field, both the steps for measuring the time-varying magnetic field and the steps for enabling the steps for measuring the time-varying magnetic field covering corresponding acts described herein and equivalents thereof.

Illustrative embodiments of the present claimed subject matter have been described in detail. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of the present disclosure.

The particular embodiments disclosed above are illustrative only, as the present claimed subject matter may be modified and practiced in different but equivalent manners apparent to those skilled in the art having the benefit of the teachings herein. Furthermore, no limitations are intended to the details of construction or design herein shown, other than as described in the claims below. It is therefore evident that the particular illustrative embodiments disclosed above may be altered or modified and all such variations are considered within the scope and spirit of the present claimed subject matter. In particular, every range of values (of the form, "from about a to about b," or, equivalently, "from approximately a to b," or, equivalently, "from approximately a-b") disclosed herein is to be understood as referring to the power set (the set of all subsets) of the respective range of values, in the sense of Georg Cantor. Accordingly, the protection sought herein is as set forth in the claims below.

What is claimed is:

1. A system for measuring a time-varying magnetic field, the system comprising:
   a plurality of induction coils arranged to measure the time-varying magnetic field using at least one voltage induced in at least one of the induction coils in the plurality of induction coils;
   a plurality of snubber circuits connected to the plurality of induction coils, each of the snubber circuits of the plurality of snubber circuits arranged to suppress a resonance of a respective one of the induction coils of the plurality of induction coils; and
   a summing circuit connected to each of the snubber circuits of the plurality of snubber circuits, the summing circuit arranged to sum voltages induced in each of the induction coils in the plurality of induction coils.

2. The system of claim 1, wherein each of the induction coils has a resonant frequency in a range of from about 100 kHz to about 10 MHz.

3. The system of claim 1 wherein the plurality of induction coils has a bandwidth in a range of from about 100 kHz to about 10 MHz.

4. The system of claim 1 wherein each of the induction coils uses a voltage follower circuit connected between each snubber circuit and the summing circuit, the voltage follower circuit arranged to buffer an input to the summing circuit.

5. The system of claim 4, wherein each of the induction coils uses a filter between the voltage follower circuit and the summing circuit.

6. The system of claim 1 wherein each of the snubber circuits comprises a capacitor, and wherein the summing circuit is connected to each of the snubber circuits over the capacitor.

7. The system of claim 6, wherein the capacitor has a capacitance that is higher than a distributed capacitance of the respective one of the induction coils.

8. The system of claim 6 wherein the capacitor has a capacitance that is higher than a capacitance of the summing circuit and/or the voltage follower circuit.

9. A system for measuring a time-varying magnetic field, the system comprising:
   a plurality of induction coils each arranged to produce an induction voltage in response to the time-varying magnetic field;
   a plurality of snubber circuits connected to the plurality of induction coils, each of the snubber circuits of the plurality of snubber circuits arranged to suppress a resonance of a respective one of the induction coils of the plurality of induction coils; and
   a summing circuit connected to each of the snubber circuits of the plurality of snubber circuits, the summing circuit arranged to sum the induction voltage induced in each of the induction coils in the plurality of induction coils.

10. The system of claim 9, wherein the plurality of induction coils, the plurality of snubber circuits, and the summing circuit are disposed in a receiver disposed in a downhole transient electromagnetic deep reading tool disposed in a borehole associated with a subterranean formation.

11. The system of claim 9 wherein each of the induction coils of the plurality of induction coils has a resonant frequency in a range of from about 100 kHz to about 10 MHz and the plurality of induction coils has a bandwidth in a range of from about 100 kHz to about 10 MHz.

12. The system of claim 9 wherein each of the induction coils of the plurality of induction coils uses a voltage follower circuit connected between each snubber circuit of the plurality of snubber circuits and the summing circuit, the voltage follower circuit arranged to buffer an input to the summing circuit.

13. The system of claim 12, wherein each of the induction coils uses a filter between the voltage follower circuit and the summing circuit.

14. The system of claim 9 wherein each of the snubber circuits of the plurality of snubber circuits comprises a capacitor, and wherein the summing circuit is connected to each of the snubber circuits of the plurality of snubber circuits over the capacitor.

15. A method for measuring a time-varying magnetic field, the method comprising:
   arranging a plurality of induction coils to measure the time-varying magnetic field using at least one voltage induced in at least one of the induction coils in the plurality of induction coils; and
   arranging a plurality of snubber circuits to suppress a resonance of a respective one of the induction coils of the plurality of induction coils, each of the snubber circuits of the plurality of snubber circuits connected to the respective one of the induction coils of the plurality of induction coils, arranged; and
   summing voltages induced in each of the induction coils in the plurality of induction coils using a summing circuit connected to each of the snubber circuits of the plurality of snubber circuits.

* * * * *